(12) United States Patent
Sugita

(10) Patent No.: US 6,437,852 B1
(45) Date of Patent: *Aug. 20, 2002

(54) EXPOSURE SYSTEM

(75) Inventor: Mitsuro Sugita, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,591

(22) Filed: Apr. 27, 1999

(30) Foreign Application Priority Data

May 2, 1998 (JP) .......................................... 10-137476

(51) Int. Cl.$^7$ .......................... G03B 27/42; G03B 27/72

(52) U.S. Cl. .......................................... 355/53; 355/69

(58) Field of Search .............................. 355/53, 18, 46, 355/86, 95, 67–71; 250/548, 492.2, 492.22, 205; 356/399–401

(56) References Cited

U.S. PATENT DOCUMENTS

| | | | | |
|---|---|---|---|---|
| 4,905,041 A | * | 2/1990 | Aketagawa | 355/53 |
| 5,272,502 A | * | 12/1993 | Saiki | 355/76 |
| 5,302,999 A | * | 4/1994 | Oshida et al. | 355/1 |
| 5,359,389 A | * | 10/1994 | Ishohata | 355/53 |
| 5,476,736 A | * | 12/1995 | Tanabe et al. | 430/22 |
| 5,498,501 A | * | 3/1996 | Shimoda et al. | 430/22 |
| 5,539,497 A | * | 7/1996 | Nishi | 355/53 |
| 5,883,700 A | * | 3/1999 | Someya | 355/53 |
| 6,061,119 A | * | 5/2000 | Ota | 355/53 |
| 6,239,861 B1 | * | 5/2001 | Nara et al. | 355/53 |

* cited by examiner

Primary Examiner—Russell Adams
Assistant Examiner—Hung Henry Nguyen
(74) Attorney, Agent, or Firm—Fitzpatrick, Cella, Harper & Scinto

(57) ABSTRACT

An exposure apparatus has a first exposure part which exposes a wafer directly with an exposure beam and a second exposure part which projects and exposes a pattern of a mask onto the wafer. The exposure system performs multiple exposure including performing exposure a plurality of times by using the first exposure part and the second exposure part.

12 Claims, 16 Drawing Sheets

FIG. 3(A)
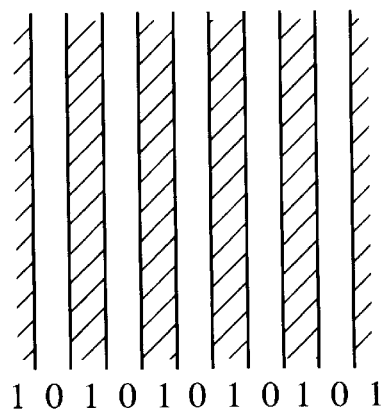
1 0 1 0 1 0 1 0 1 0 1
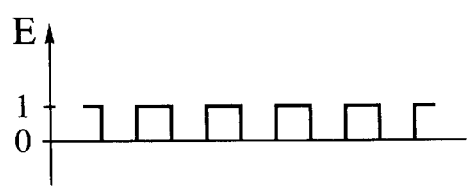
FIG. 3(B)
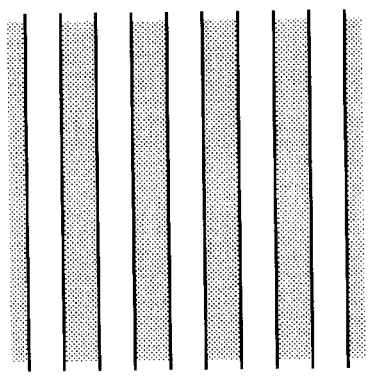
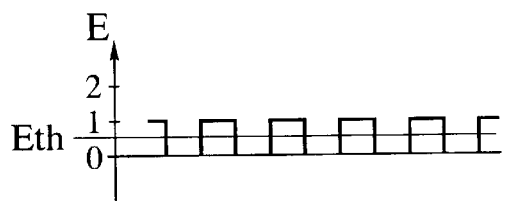
FIG. 4(A)
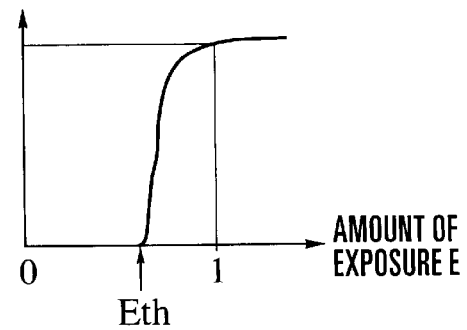
(1) IN THE CASE OF NEGATIVE RESIST
FIG. 4(B)
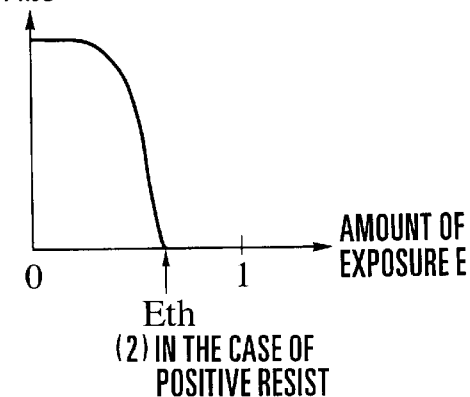
(2) IN THE CASE OF POSITIVE RESIST

FIG. 7
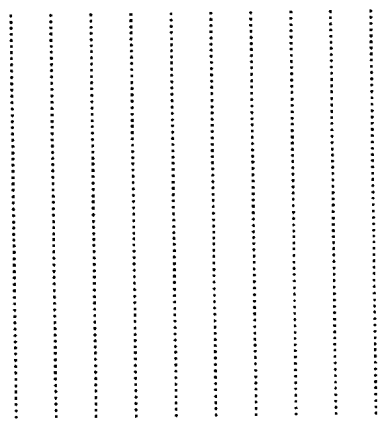
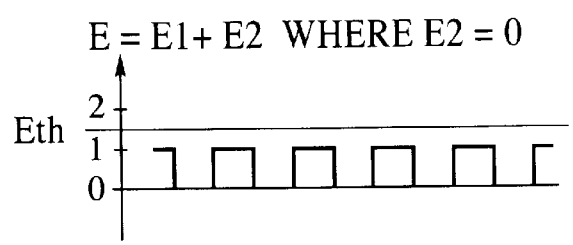
FIG. 8(A)
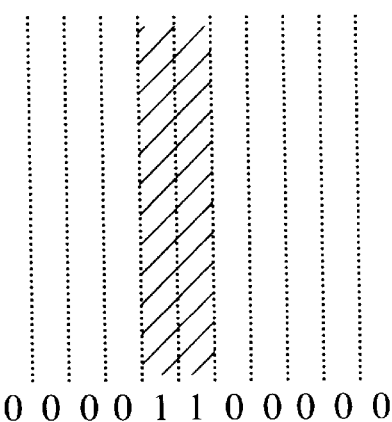
0 0 0 0 1 1 0 0 0 0
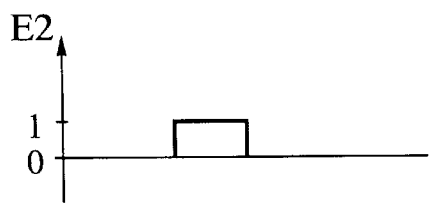
FIG. 8(B)
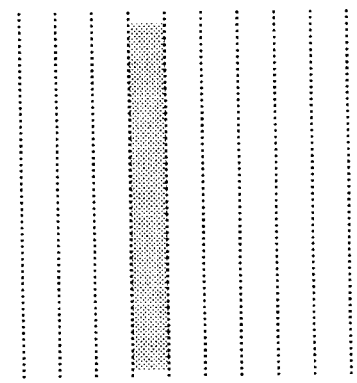
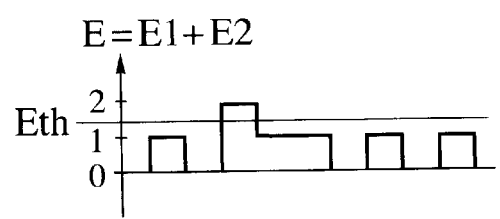

F I G. 26
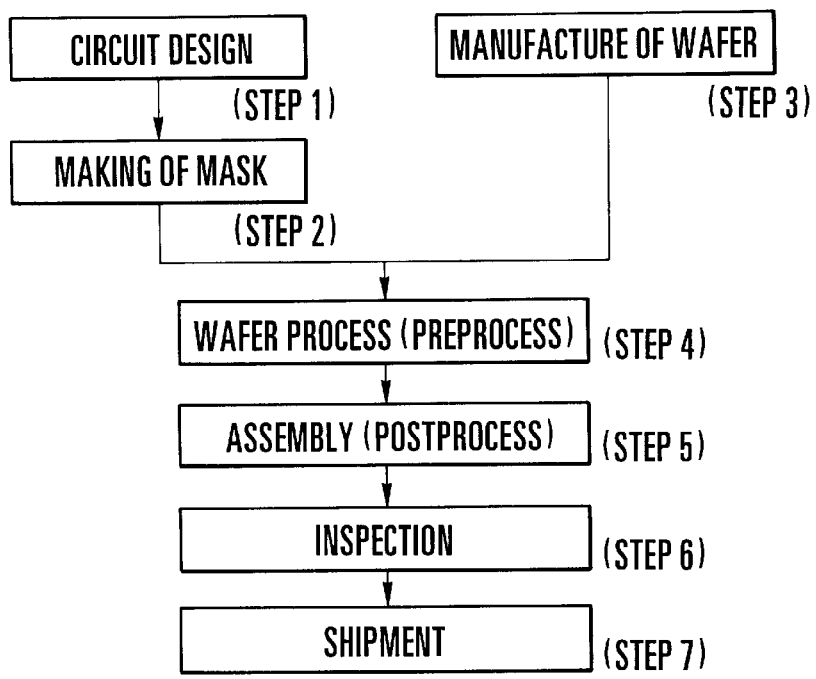
F I G. 27
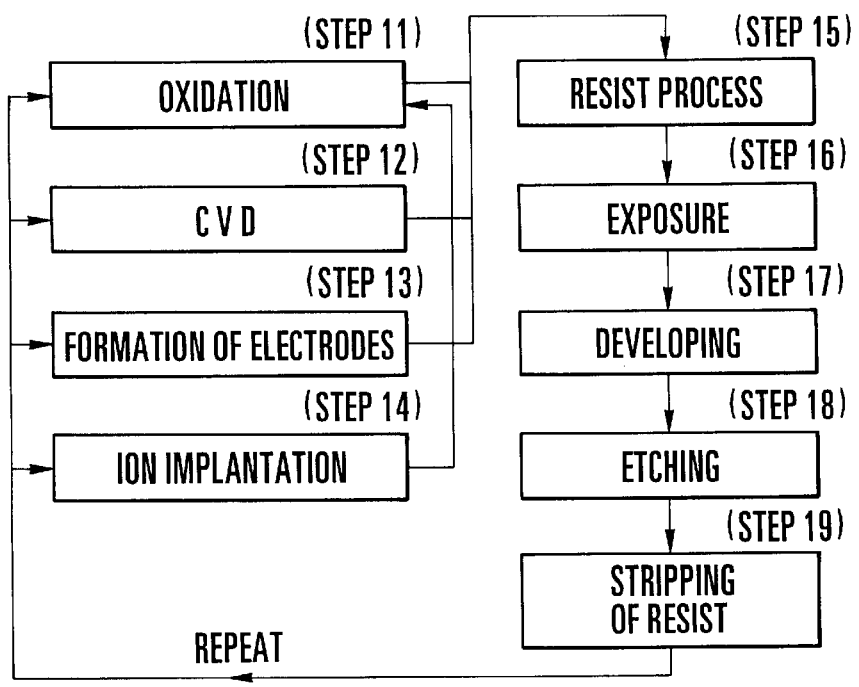

EXPOSURE SYSTEM

BACKGROUND OF THE INVENTION

1. Field of the Invention

The present invention relates to an exposure system for exposing photosensitive substrates, such as silicon plates and glass, to light through patterns designed for devices, such as semiconductors including an IC, an LSI, etc., a liquid crystal panel, a magnetic head, a CCD (image sensor), and so on.

2. Description of Related Art

In manufacturing an IC, an LSI, a liquid crystal element, etc., by photolithography, a projection aligner (projection exposure apparatus) is employed. The projection aligner is arranged to perform an exposure by projecting through a projection optical system a pattern of a photomask or a reticle (hereinafter referred to as a "mask") onto a substrate, such as a silicon plate or a glass plate, which is coated with a photoresist or the like (hereinafter referred to as a "wafer" in general).

FIG. 1 schematically illustrates the arrangement of a conventional projection aligner. In FIG. 1, there are illustrated a KrF excimer laser 251 used as a light source, an illumination optical system 252, illumination light 253, a mask 254, exposure light 255 on the object side, a projection optical system 256, exposure light 257 on the image side, a photosensitive substrate (wafer) 258, and a substrate stage 259 which holds the photosensitive substrate 258.

In the conventional projection aligner, a laser beam emitted from the excimer laser 251 is led to the illumination optical system 252. At the illumination optical system 252, the laser beam is converted into the illumination light 253 having a light intensity distribution, a luminous distribution, etc., which are predetermined. The illumination light 253 falls on the mask 254. A circuit pattern which is to be eventually formed on the photosensitive substrate 258 is beforehand formed on the mask 254 with chromium or the like. The incident illumination light 253 passes through the mask 254 and is diffracted by the circuit pattern to become the object-side exposure light 255. The projection optical system 256 converts the exposure light 255 into the image-side exposure light 257 to image the circuit pattern on the photosensitive substrate 258 at a predetermined magnification with sufficiently small aberrations. As shown in an enlarged view at the lower part of FIG. 1, the image-side exposure light 257 converges on the photosensitive substrate 258 at a predetermined NA (numerical aperture=sinθ) to form the image there. To have the circuit pattern formed in a plurality of shot areas on the photosensitive substrate 258, the substrate stage 259 is arranged to be movable stepwise to vary the relative positions of the photosensitive substrate 258 and the projection optical system 256.

However, with the conventional projection aligner using the KrF excimer laser arranged as described above, it is difficult to form a pattern image of a line width not greater than 0.15 μm.

The reason for this difficulty is as follows. The resolution of the projection optical system is limited by a trade-off between an optical resolution and the depth of focus due to the wavelength of the exposure light. The resolution R of the resolving pattern of the projection aligner and the depth of focus DOF can be expressed by the following Rayleigh's formulas (1) and (2):

$$R = k1 \frac{\lambda}{NA} \quad (1)$$

$$DOF = k2 \frac{\lambda}{NA^2} \quad (2)$$

In the above formulas, λ represents the wavelength of the exposure light, NA represents a numerical aperture indicative of the brightness of the optical system on the light exit side, and k1 and k2 represent constants which are normally between 0.5 and 0.7.

According to the formulas (1) and (2), in order to make the resolution R smaller for a higher degree of resolution, it is necessary either to make the wavelength λ smaller for a shorter wavelength or to make the value NA larger for a higher degree of brightness. At the same time, however, the depth of focus DOF required for a necessary performance of the projection optical system must be kept at least at a certain value. This requirement imposes some limitation on the increase of the brightness value NA.

Meanwhile, known exposure apparatuses capable of giving also a high degree of resolution include probe-type exposure apparatuses.

FIG. 16 schematically shows the arrangement of a proximity-field probe exposure apparatus as one example of such probe-type exposure apparatuses.

Referring to FIG. 16, there are illustrated an exposure part 151, a laser light (beam) source 152, light source control means 153, an optical fiber transmission part 154, an optical fiber probe 155, an alignment part 156, a wafer 157, a wafer stage 158, and a wafer stage control part 159. In this example, the exposure part 151 which is arranged to generate exposure light is fixed. The wafer 157, which is a photosensitive substrate, is arranged to have its position controlled by moving the wafer stage 158 relative to the probe 155 according to information on the measured position of an alignment mark obtained with the alignment part 156 in its position (1). At the same time, the generation of exposure light from the probe 155 is controlled. Under such control, the wafer 157 is exposed to light of a circuit pattern in the neighborhood of its position (2).

The proximity-field probe exposure is carried out by introducing the exposure light into the optical fiber probe 155 which has its tip sharply formed. A circuit (exposure) pattern is formed on the wafer 157, i.e., the photosensitive substrate, by exposing the wafer 157 to a non-propagating component of the exposure light, i.e., proximity-field light, which seeps out from a microaperture part of the tip of the optical fiber probe 155, depends on the shape or size of the microaperture part and has a tiny spread less than a wavelength. FIG. 17 schematically shows an example of the optical fiber probe 155. In the case of this example, the probe 155 is completely covered with a metal coating 155b except an aperture part 155a of the tip for the purpose of converging the light propagating inside of the optical fiber toward the tip of the probe 155 and also for the purpose of preventing the S/N ratio of the exposure light from being degraded at the proximity field by scattering or transmission of non-proximity-field light taking place in the neighborhood of the aperture part 155a.

The resolution of such an exposure system is determined by the aperture diameter and the sharpness of the tip of the optical fiber probe 155.

According to the current level of technology, an optical fiber probe can be prepared with the aperture diameter of the tip measuring less than 50 nm. The resolution of such a probe is much finer than that of the above-stated conventional projection aligner which has the aperture diameter of the tip of the probe at 200 nm or thereabout.

There are other known probe exposure methods, besides the above-stated method of using the proximity-field light. Other known probe exposure methods include a method called STM (scanning tunneling microscopy) which uses a tunneling current and a method called AFM (atomic force microscopy) which uses an interatomic force.

However, these probe exposure methods have a shortcoming in that the rate of throughput attainable by these methods is low. This is because an exposure area which can be covered by one shot of exposure in the probe exposure method is substantially the same as the minute size of the tip of the probe. In order to depict a circuit pattern over a wide exposure area, the wide area, therefore, must be exposed by spending much time.

FIG. 18 shows a probe part of the probe exposure apparatus, in which the probe part is made into a multiple probe so as to improve the rate of throughput by performing the simultaneous exposure using the multiple probe. For example, the rate of throughput can be increased by an N number of times by arranging the multiple probe to be composed of N probes 171 to 175. This improvement is furthered by a probe exposure apparatus having a much greater number of probes 181 which are two-dimensionally arranged as shown in FIG. 19. With the probe exposure apparatus arranged in this manner, a wide exposed area can be attained, like in the case of the conventional projection aligner, by carrying out a block (or batch) exposure. Then, the wafer can be exposed at an improved rate of throughput. Further, the resolution attainable by such apparatus can be improved by obliquely arranging the probes with respect to the two-dimensional array.

FIG. 20 shows by way example the arrangement of making a probe of a type which differs from the optical fiber probe into a multiple probe. In the case of FIG. 20, a surface emitting laser 190, a microaperture 197 and a cantilever 199 are used for each unit of the multiple probe.

Although a high degree of resolution having a line width not exceeding 100 nm can be attained by the probe exposure described above, it is hardly possible to form circuit patterns at a high rate of throughput required by an actual manufacturing operation.

BRIEF SUMMARY OF THE INVENTION

It is an object of the invention to provide an exposure system which gives a high throughput with a high degree of resolution.

To attain the above object, in accordance with an aspect of the invention, there is provided an exposure system, which comprises a first exposure part arranged to perform a probe exposure, and a second exposure part arranged to perform a projection exposure, wherein the exposure system has a multiple exposure mode in which a multiple exposure is performed by using both the first exposure part and the second exposure part in combination.

Further, the probe exposure in the multiple exposure mode is performed in such a manner that a first exposure pattern having an exposure amount not exceeding a threshold value of an object (resist) to be exposed is formed, the projection exposure in the multiple exposure mode is performed in such a manner that a second exposure pattern having an exposure amount exceeding the threshold value and an exposure amount not exceeding the threshold value is formed, and the respective exposure amounts are determined in such a manner that a composite exposure pattern formed by combining the first and second exposure patterns is in such a relation to the threshold value that a desired circuit pattern is formed.

The above and other objects and features of the invention will become apparent from the following detailed description of preferred embodiments thereof taken in connection with the accompanying drawings.

BRIEF DESCRIPTION OF THE SEVERAL VIEWS OF THE DRAWINGS

FIGS. 3(A) and 3(B) schematically show exposure patterns obtained by a probe exposure.

FIGS. 4(A) and 4(B) show exposure sensitivity characteristics of a resist.

FIG. 7 schematically shows a pattern formed in accordance with the invention.

FIGS. 8(A) and 8(B) show, by way of example, patterns formed according to a first embodiment of the invention.

FIG. 26 is a flow chart showing a flow of semiconductor-device manufacturing processes to be executed according to the invention.

FIG. 27 is a flow chart showing also a flow of semiconductor-device manufacturing processes to be executed according to the invention.

DETAILED DESCRIPTION OF THE INVENTION

Hereinafter, preferred embodiments of the invention will be described in detail with reference to the drawings.

One of multiple exposure methods to which the invention is applied as a first embodiment is first described referring to FIG. 2 to FIGS. 10(A) and 10(B).

Figure 1:
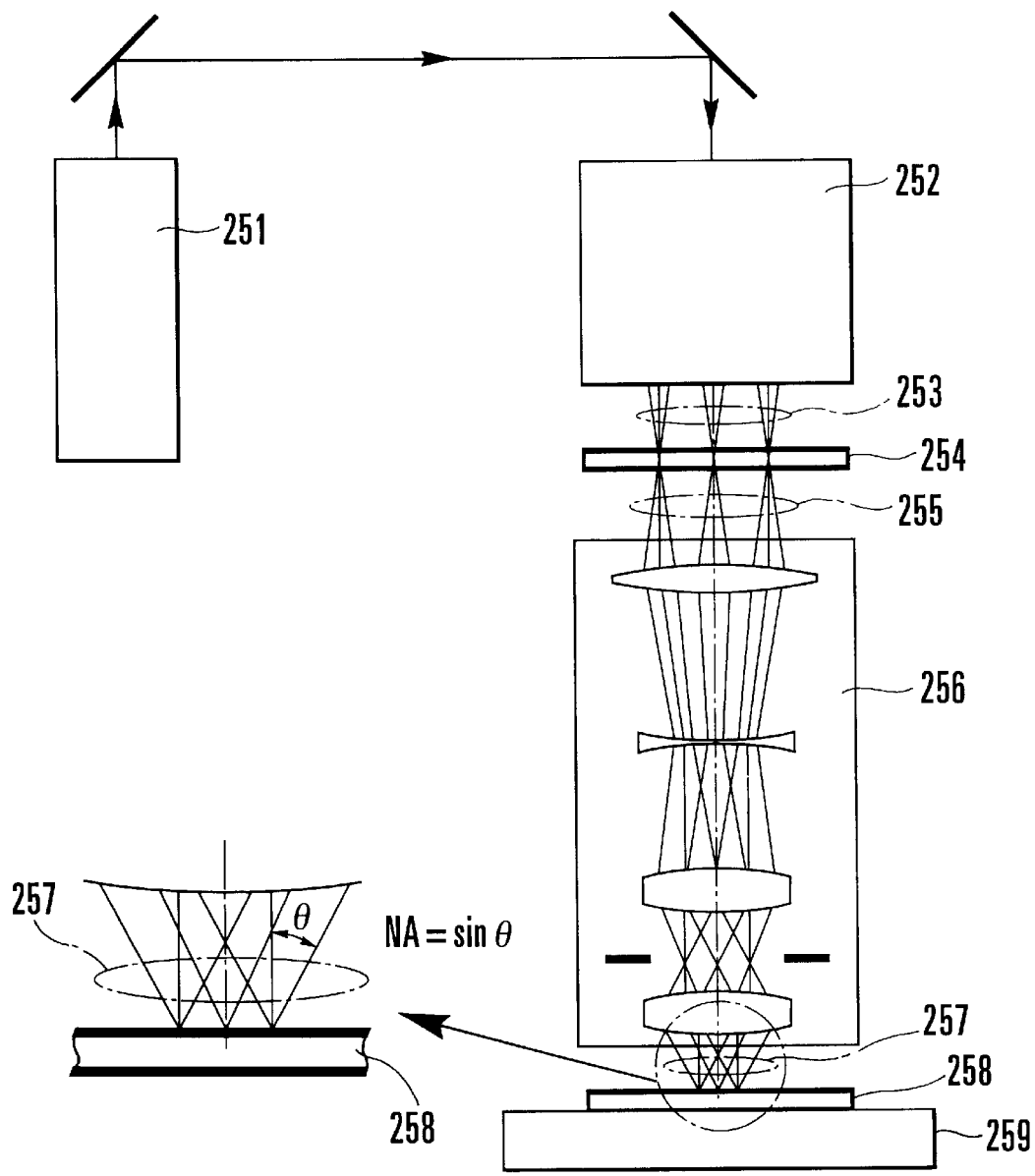
FIG. 1 schematically shows a conventional projection aligner.
Figure 2:
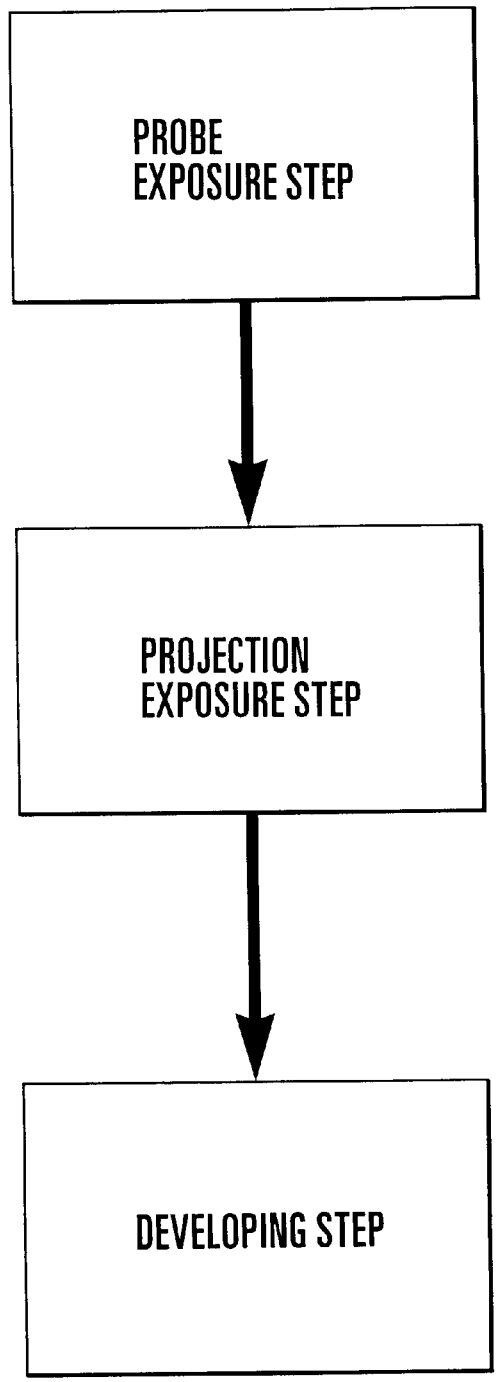
FIG. 2 is a flow chart showing a basic flow of an exposure method according to the invention.

FIG. 2 is a flow chart showing a basic flow of processes of the multiple exposure method. In FIG. 2, there are indicated a probe exposure step and a projection exposure step which constitute a multiple exposure, in addition to a developing step. The sequence of the probe exposure step and the projection exposure step does not have to be as shown in the flow chart of FIG. 2. The projection exposure step may be executed before the probe exposure step. Further, in a case where each of the probe exposure step and the projection exposure step is to be executed a plurality of times, these steps may be alternately executed. Furthermore, some alignment step or the like may be inserted in between the probe exposure step and the projection exposure step for the purpose of enhancing image forming precision. Thus, the structural arrangement according to the invention is not limited by the flow chart of FIG. 2.

In the case of the multiple exposure shown in the flow chart of FIG. 2, a photosensitive substrate is exposed to the light of a periodic pattern resembling interference fringes by the probe. FIGS. 3(A) and 3(B) schematically show such a periodic pattern. In FIG. 3(A), each numeral indicates the amount of exposure (exposure amount), and the exposure amount of each of the hatched parts is "1" while that of each of the white parts is "0". In developing the photosensitive substrate exposed with the above periodic pattern, an exposure threshold value Eth of the photosensitive substrate is set at a value between "0" and "1", as shown in FIG. 3(B).

FIGS. 4(A) and 4(B) show the dependency on the exposure amount E of the film thickness "d" after developing of a resist part of the photosensitive substrate and the exposure threshold value Eth for the negative resist and the positive resist, respectively. The film thickness "d" after developing becomes "0" at a portion where the exposure has been made to an exposure amount equal to or greater than the exposure threshold value Eth in the case of the positive resist, or where the exposure has been made to an exposure amount less than the exposure threshold value Eth in the case of the negative resist.

Figure 5:
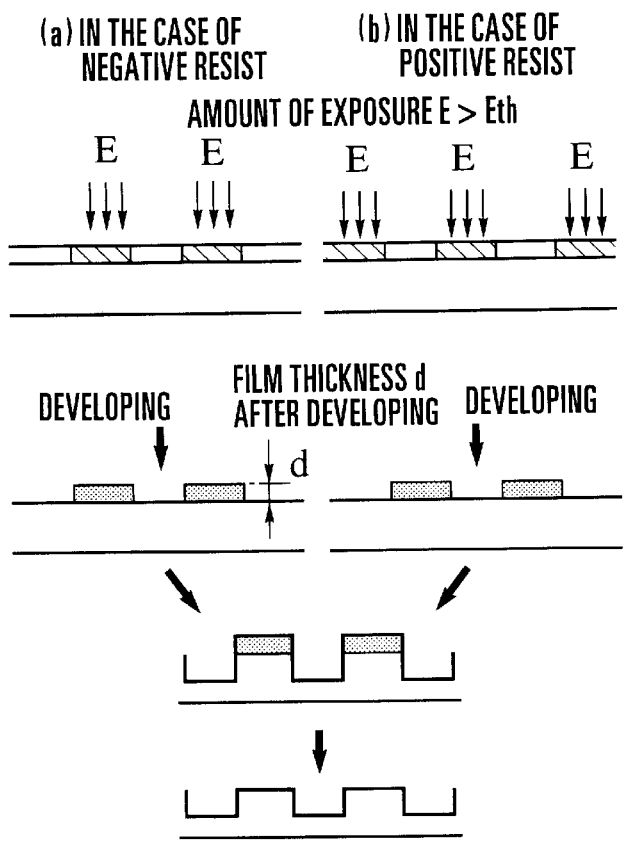
FIG. 5 schematically shows the manner of formation of a pattern by a developing process.

FIG. 5 schematically shows, for each of the positive resist and the negative resist, the manner in which a lithography pattern is formed through developing and etching processes after the above-stated exposure.

Figure 6:
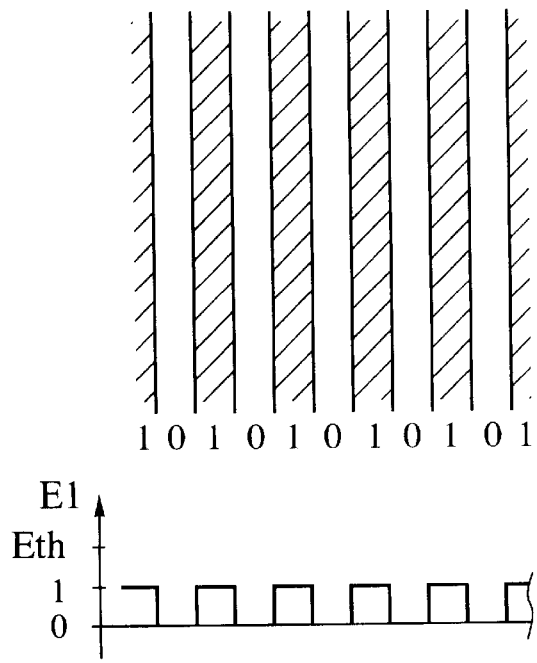
FIG. 6 schematically shows an exposure pattern obtained by the probe exposure.

In the case of the multiple exposure as shown in FIG. 2, if a maximum exposure amount is set to "1" for the probe exposure step, the exposure threshold value of the resist is set to a value greater than "1". In the photosensitive substrate as set in the above manner, in a case where an exposure pattern obtained as shown in FIG. 6 by carrying out only the probe exposure is developed, the exposure amount is insufficient, and, although the film thickness somewhat varies, there exists no portion where the film thickness becomes "0", so that no lithography pattern is formed (see FIG. 7). The probe exposure pattern then can be considered to have disappeared. (In the following, the use of a negative resist is described by way of example. However, the invention is of course not limited to the use of the negative type nor that of the positive type. Both types of resists are selectively usable as desired in accordance with the invention.)

An advantageous feature of the first embodiment lies in the following point. A high-resolution periodic pattern which seems to disappear if processed by the probe exposure alone is merged with a pattern obtained by the projection exposure. Then, the high-resolution periodic pattern is selectively revived by the above merger and reproduced to form a lithography pattern as desired.

The first embodiment of the invention is next described.

Figure 20:
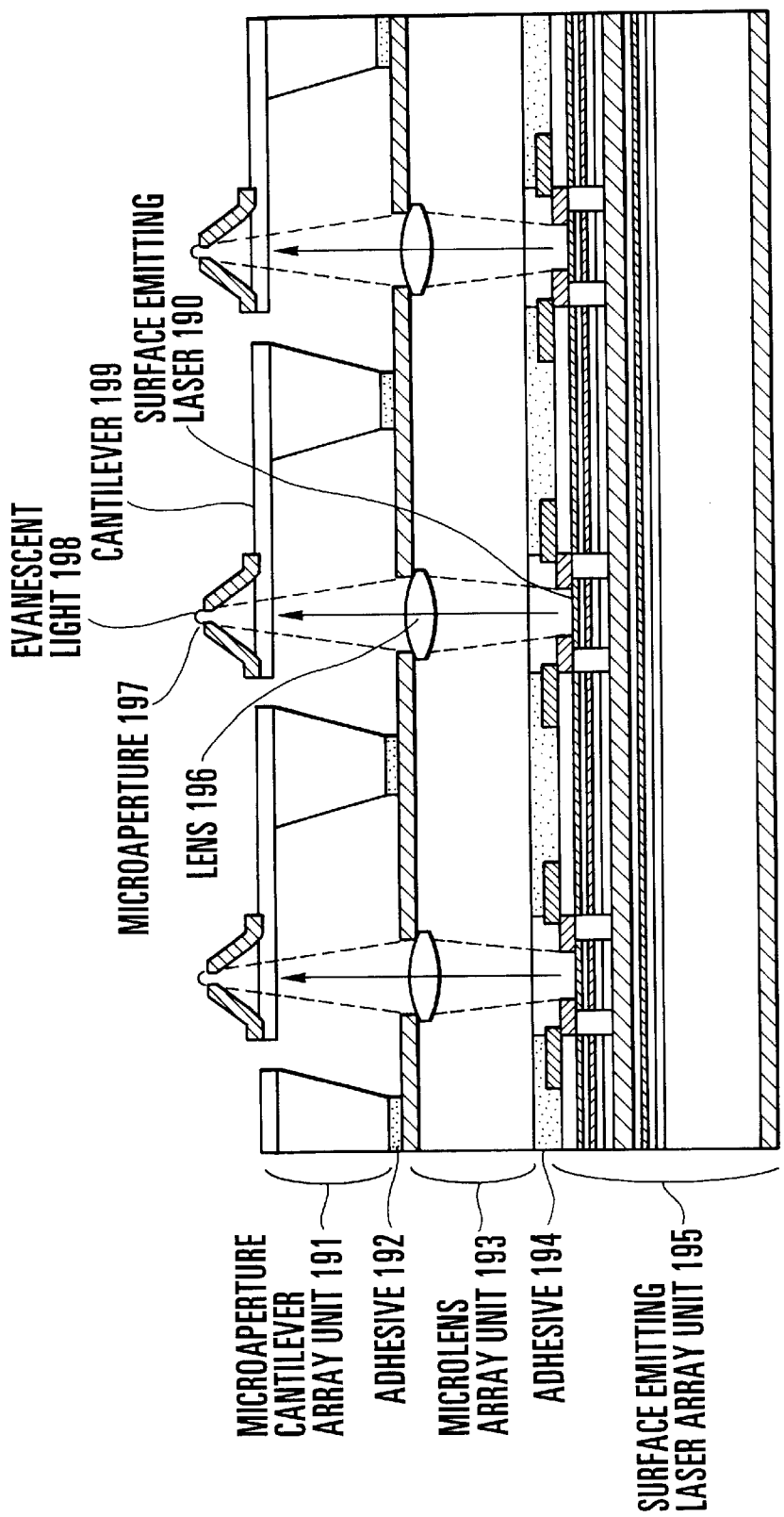
FIG. 20 schematically shows the arrangement of a multiple microaperture probe system.

In the case of the first embodiment, a probe exposure step for an exposure with the periodic pattern shown in FIGS. 3(A) and 3(B) is carried out by using the proximity-field probe exposure apparatus having a multiple probe of a two-dimensional array as shown in FIG. 20.

The proximity-field probe exposure apparatus has a proximity-field multiple probe exposure head which is composed of a combination of multiple apertures and multiple surface emitting lasers. The basic period of arrangement of a plurality of probes of the proximity-field multiple probe exposure head is 10 $\mu$m. In the first embodiment, to make an exposure in a pattern of a period not exceeding 100 nm with the proximity-field probe exposure head 180, the direction in which the multiple probes of the proximity-field multiple probe exposure head 180 is two-dimensionally arranged is slightly inclined with respect to the scanning (relative movement) direction of the photosensitive substrate.

FIG. 8(A) shows an exposure pattern (image) obtained by the projection exposure step. In the case of the first embodiment, a periodic pattern formed by the proximity-field probe exposure step is assumed to have a resolution of 50 nm L&S (line and space). The resolution (smallest line width) of an exposure pattern formed by the normal projection exposure step is assumed to be 100 nm, which is one half of the resolution of the probe exposure step. The exposure pattern is thus formed by the projection exposure step to have a line width which is twice as large as that of the exposure pattern formed by the probe exposure step, as shown in FIG. 8(A). Further, an exposure apparatus which is capable of carrying out the projection exposure at the resolution of a line width 100 nm can be selected from among a group of apparatuses including an ultraviolet beam exposure apparatus using an ArF excimer laser (wavelength 193 nm) and a phase-shifting mask and arranged by an ultra high resolution technique. The basic multiple exposure method of the exposure apparatus is the same as the method shown in FIG. 2.

Assuming that the projection exposure step which gives the pattern of FIG. 8(A) is carried on at the same portion after the probe exposure step which gives the pattern of FIG. 6, without executing the developing step, the distribution of the sum the of exposure amounts becomes as shown at the lower part of FIG. 8(B). In this instance, the exposure amount of the probe exposure and the exposure amount of the projection exposure are in the ratio of 1:1. The exposure threshold value Eth is set between exposure amounts "1" and "2" in the same manner as in the case of a FIG. 7 showing the disappearance of pattern. Therefore, when a developing process is performed after such a double exposure, a lithography pattern is formed as shown at the upper part of FIG. 8(B). This lithography pattern is in relief (protrusive pattern) in the case of the negative resist and in intaglio (recessed pattern) in the case of the positive resist. The thus-obtained lithography pattern has the same resolution as in the probe exposure, and is not a periodic pattern but an isolated pattern. Thus, this multiple exposure gives a pattern which is of such a high resolution that is higher than a resolution attainable by the projection exposure and which is not attainable by carrying out the probe exposure alone.

Figure 9A:
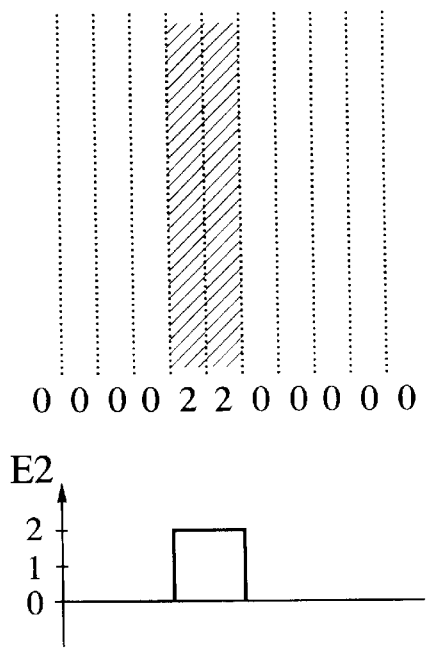
FIGS. 9(A) and 9(B) show other examples of patterns formed according to the first embodiment.
Figure 9B:
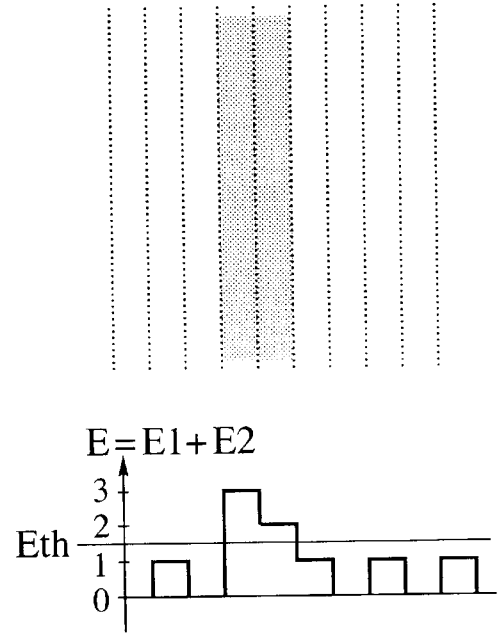

FIG. 9(A) shows a case where the projection exposure is carried out with a pattern of a line width twice as large as the above-stated line width and at an exposure amount which is greater than the exposure threshold value Eth (an exposure amount two times as much as the exposure threshold value Eth in this case). After that, when the developing process is carried out, a pattern obtained by the probe exposure disappears leaving only a lithography pattern formed by the projection exposure, as shown at the upper part of FIG. 9(B).

Figure 10A:
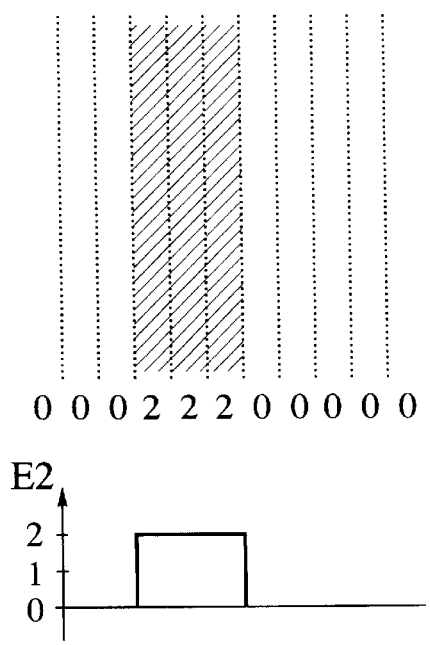
FIGS. 10(A) and 10(B) show further examples of patterns formed according to the first embodiment.
Figure 10B:
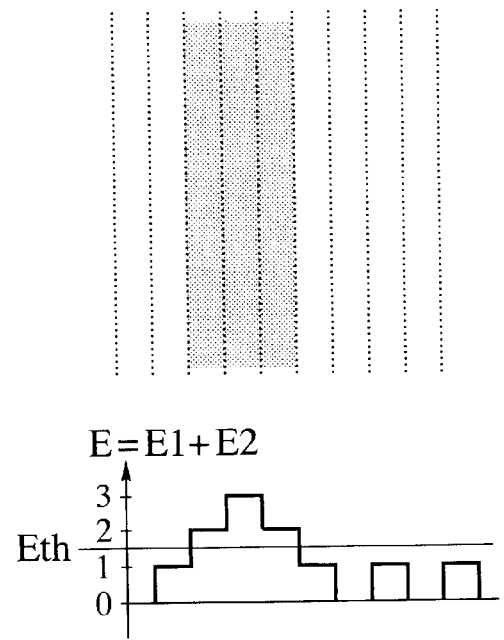

FIGS. 10(A) and 10(B) show a case where the projection exposure is carried out with a pattern of a line width three times as large as the smallest line width for the probe exposure. As shown, the result of this exposure is also the same as that in the case of FIGS. 9(A) and 9(B). As is apparent from the above, any projection exposure with a pattern of a larger line width can be likewise carried out by basically combining the twofold line width and the threefold line width, so that all of the patterns attainable by the projection exposure can be formed.

The first embodiment is arranged, as described above, to carry out the probe exposure and the projection exposure in combination. In carrying out the exposures, the exposure amount of each exposure is adjusted oppositely to the exposure threshold value Eth of the resist of the photosensitive substrate. Any of various lithography patterns such as those shown in FIGS. 8(B), 9(B) and 10(B) can be formed in such a way as to have its smallest line width become the resolution attainable by the probe exposure.

The above multiple exposure method according to the first embodiment is recapitulated as follows.

(i) Any part of the pattern of the probe exposure step where the total exposure amount obtained after the projection exposure step is less than the exposure threshold value is caused to disappear by the developing process.

(ii) As regards the pattern areas where the exposure is effected by the projection exposure step at an exposure amount less than the exposure threshold value, parts of the pattern where the total of exposure amounts obtained by the projection exposure step and the probe exposure step exceeds the exposure threshold value Eth are selectively brought about to have a lithography pattern formed by the developing process in such a way as to give the resolution attainable by the probe exposure.

(iii) The areas of the pattern at which an exposure is made by the projection exposure step at an exposure amount greater than the exposure threshold value are included as they are in the lithography pattern formed by the developing process.

The depth of focus obtained at the probe exposure step is fairly large and is, therefore, advantageous in forming a pattern. Further, the sequence of the probe exposure and the projection exposure may be conversely arranged.

Figure 11:
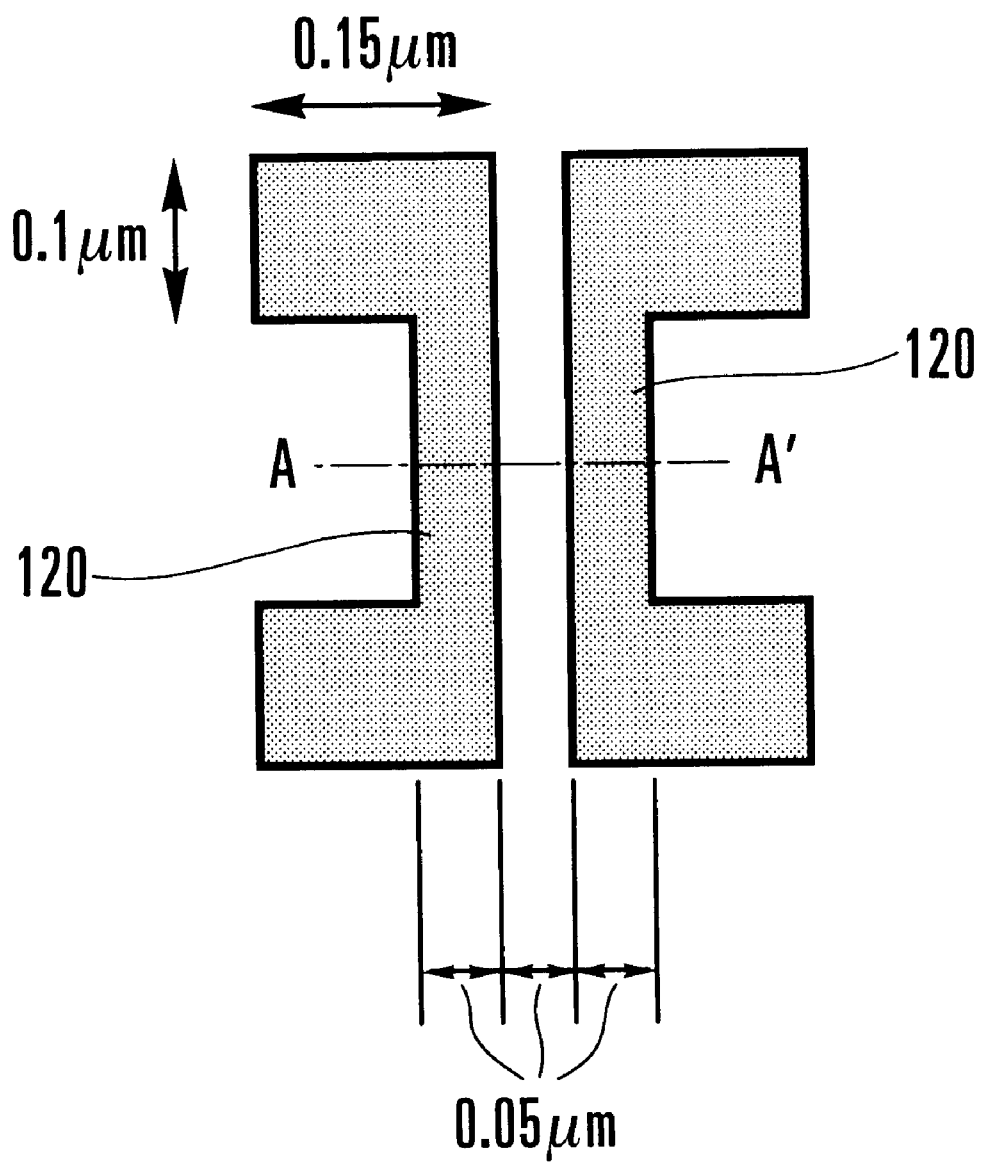
FIG. 11 shows a typical circuit pattern.

A second embodiment of the multiple exposure method of the invention is next described with reference to FIG. 11 and FIGS. 12(A) to 12(D). In the case of the second embodiment, a circuit pattern to be obtained by the exposure is a so-called gate-type pattern which is as shown in FIG. 11. In the gate-type pattern, the smallest line width in the horizontal direction, i.e., in the direction of a line A–A', is 0.05 $\mu$m, while the smallest line width in the vertical direction is 0.1 $\mu$m.

In this case, the probe exposure step which gives a high resolution pattern is applied only to a vertical pattern 120, which necessitates the high resolution.

Figure 12A:
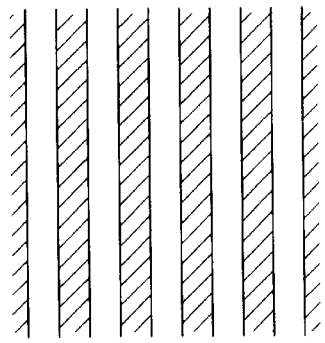
FIGS. 12(A) to 12(D) schematically show exposure patterns formed according to a second embodiment of the invention.

FIG. 12(A) shows a one-dimensional periodic exposure pattern (distribution of image intensity or exposure amount) obtained by the probe exposure. The period of the one-dimensional periodic exposure pattern is 0.1 $\mu$m, which corresponds to a periodic pattern image of 0.05 $\mu$m L&S (line and space). The periodic pattern image is prepared by using the proximity-field probe exposure apparatus shown in FIGS. 16 to 19 or FIG. 20. Numerals "0" and "1" shown at the lower part of FIG. 12(A) indicate the amounts of exposure (exposure amounts).

Figure 12B:
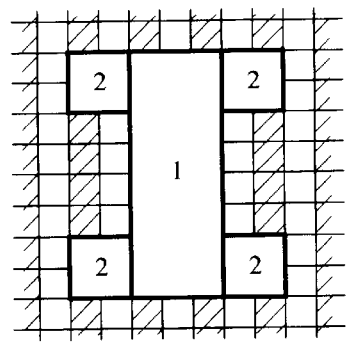

After the probe exposure step, an exposure is made with an exposure pattern 130 shown in FIG. 12(B) as the projection exposure. This projection exposure is made also by using the projection aligner shown in FIG. 16. The upper part of FIG. 12(B) shows a positional relation between the exposure pattern of the probe exposure and the exposure pattern of the projection exposure, and an amount of exposure obtained at each of different areas by the projection exposure step. At the lower part of FIG. 12(B), the exposure amounts obtained by the projection exposure step are shown in a state of being mapped by the resolution of 0.05 $\mu$m pitch.

As is understandable from FIG. 12(B), the smallest line width of the exposure pattern of the projection exposure is 0.1 $\mu$m, which is twice as large as that of the exposure pattern of the probe exposure.

Further, another method of carrying out the projection exposure to give the exposure pattern wherein the exposure amount varies with the area of the pattern uses a mask which is arranged as follows. The mask has a plurality of stepped (multiple) transmission factors including aperture parts of a transmission factor T% corresponding to the areas indicated by "1" in FIG. 12(B) and aperture parts of a transmission factor 2T% corresponding to the areas indicated by "2" in FIG. 12(B). By this method, the projection exposure can be finished by carrying it out only once. In this case, a ratio among the exposure amounts obtained on the photosensitive substrate by the respective exposure steps is as follows: "probe exposure":"projection exposure at the aperture part of transmission factor T":"projection exposure at the aperture part of transmission factor 2T"=1:1:2.

Other types of masks arranged to give exposure patterns in which the exposure amount varies with the area of the pattern include a mask which has an aperture part analogous to the gate pattern shown in FIG. 11. In this case, the image of the vertical pattern 120 which has the smallest line width cannot be resolved and, therefore, has a smaller exposure amount than other parts. As a result, there is obtained an exposure pattern which resembles the pattern shown at the upper part of FIG. 12(B).

Figure 12C:
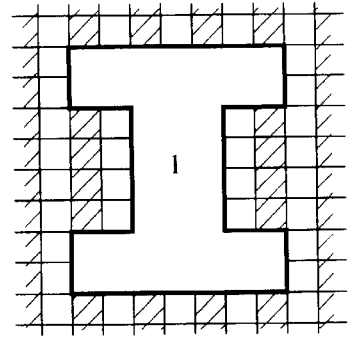
Figure 12D:
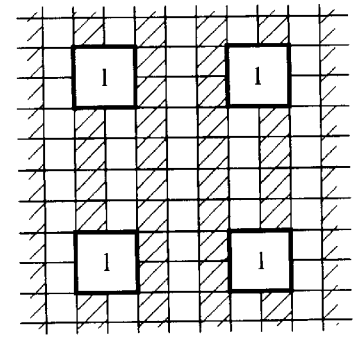

Further, there is another method in which an exposure is made twice by using masks of two kinds which give exposure patterns of predetermined exposure amounts as shown at the upper and lower parts of FIG. 12(D). In the case of this method, since it is sufficient to have one step of exposure amount, the masks can be arranged in an ordinary manner to have only one step of transmission factor. The ratio among the exposure amounts obtained on the photosensitive substrate in this case is as follows: "probe exposure":"projection exposure for the first time":"second projection exposure for the second time"=1:1:1.

The formation of a lithography pattern by the above-stated combination of the probe exposure and the projection exposure is next described as follows. In the case of such a multiple exposure, since there is no developing step arranged between the probe exposure and the projection exposure, the exposure amount of the exposure pattern obtained by one exposure step is added to that of the exposure pattern obtained by the other exposure step. After the addition, an exposure pattern is newly formed showing a distribution of exposure amounts and that of latent image intensity.

The exposure pattern obtained as a result of the addition of the exposure amounts of the two different exposure steps in the second embodiment is shown at the upper part of FIG. 12(C). The lower part of FIG. 12(C) shows, in a gray tone, a lithography pattern obtained by developing the exposure pattern shown at the upper part of FIG. 12(C). Further, in the case of the second embodiment, the exposure threshold value Eth of the photosensitive substrate used is not less than "1" and not greater than "2". The lithography pattern is formed in relief (protrusive pattern) in the case of a negative resist and in intaglio (recessed pattern) in the case of a positive resist.

The lithography pattern shown in gray at the lower part of FIG. 12(c) coincides with the gate pattern shown in FIG. 11, so that it is understandable that this pattern can be formed by the exposure method of the second embodiment.

Figure 15:
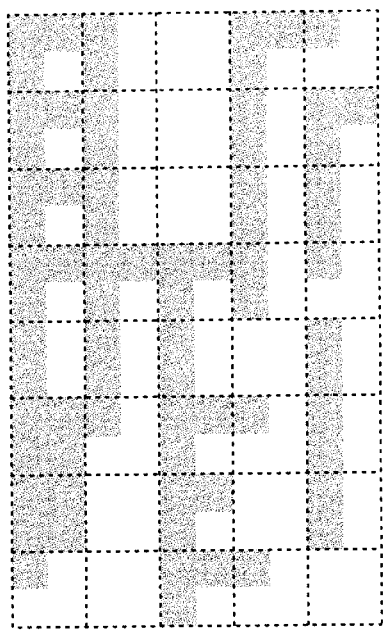
FIG. 15 schematically shows, by way of example, a pattern which can be formed according to the third embodiment.
Figure 16:
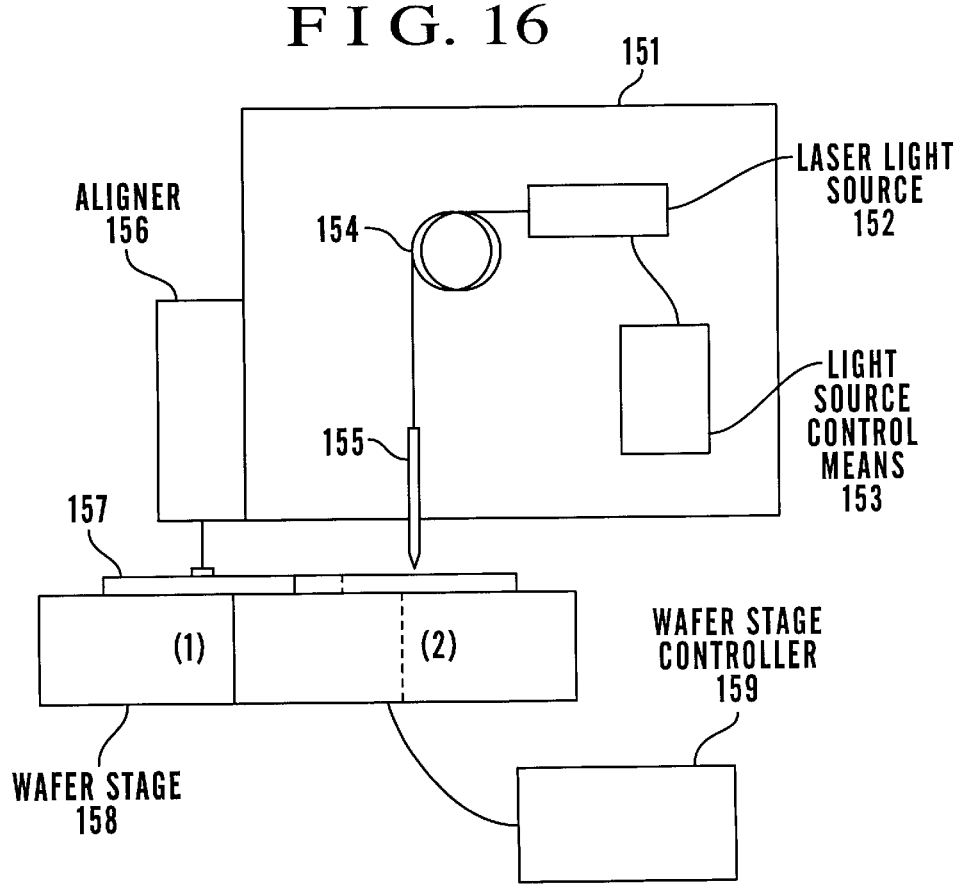
FIG. 16 schematically shows the arrangement of an example of a probe exposure apparatus.
Figure 17:
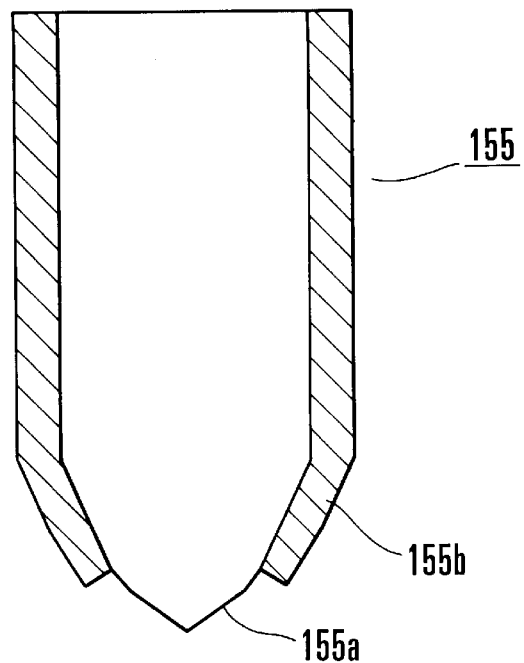
FIG. 17 shows one example of a probe.
Figure 18:
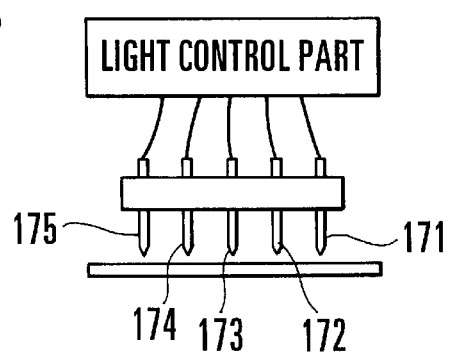
FIG. 18 schematically shows one example of the arrangement of a multiple probe.
Figure 19:
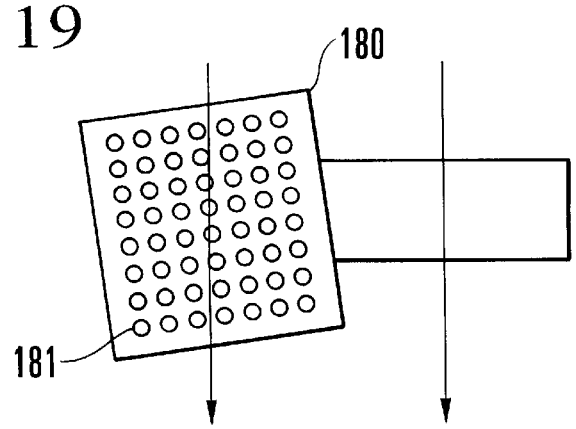
FIG. 19 schematically shows one example of the arrangement of a two-dimensional multiple probe.

A third embodiment of the invention is next described below with reference to FIGS. 13, 14 and 15.

In the case of the third embodiment, also, the invention is applied to the proximity-field probe exposure apparatus shown in FIGS. 16 to 19 or FIG. 20, and a two-dimensional periodic pattern is formed by the projection exposure step. FIG. 13 schematically shows a two-dimensional exposure pattern obtained by the probe exposure, as a map of exposure amounts. To increase the possible variations of the final exposure pattern, the third embodiment is arranged to cause the exposure amounts of the periodic patterns which are respectively obtained in the two different directions (X and Y directions) by the probe exposure step to differ from each other. More specifically, the exposure amount in one of the two directions is arranged to be twice as large as the exposure amount in the other direction. Incidentally, the exposure amounts in the two directions, however, may be arranged to be the same as each other.

Figures 13, 14:
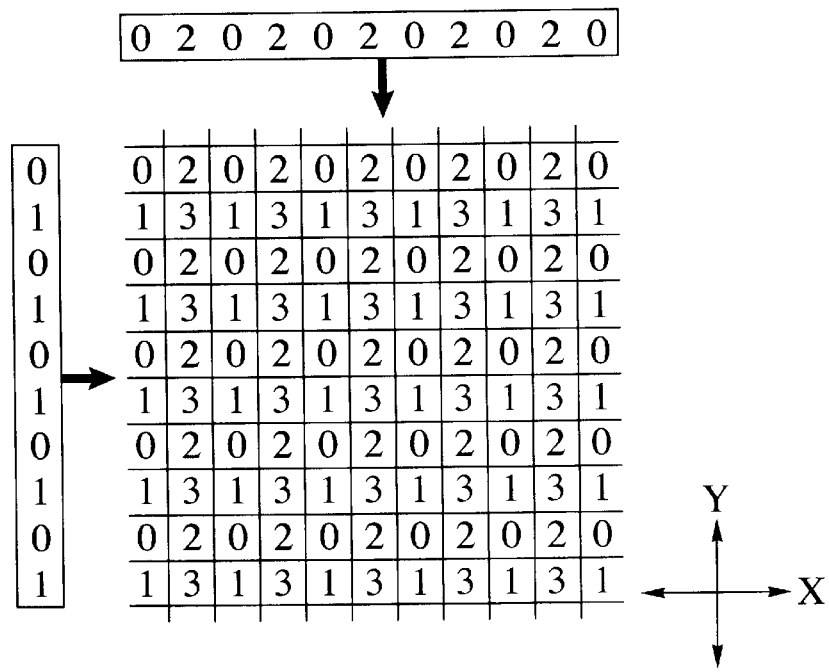
FIG. 13 schematically shows an exposure pattern formed by a probe exposure according to a third embodiment of the invention.
FIG. 14 schematically shows a pattern formed by two-dimensional blocks.

In the exposure pattern shown in FIG. 13, as a result of the probe exposure step, the amounts of exposure obtained on the resist in the two directions X and Y are of four stepped values. In order to bring about a sufficient effect over the probe exposure, the number of steps of exposure amounts of the projection exposure must be at least five. In addition to that, the exposure threshold value of the resist applied to the photosensitive substrate is set at a value greater than "3" which is the largest exposure amount of the probe exposure and is less than "4" which is the largest exposure amount of the projection exposure.

With the projection exposure thus carried out at exposure amounts which are divided by five steps ("0", "1", "2", "3" and "4"), the exposure amounts of an exposure pattern obtained as a result of the projection exposure are shown in FIG. 14. In FIG. 14, gray parts represent parts having exposure values equal to or above the exposure threshold value, which parts become an exposure pattern that is finally converted by the developing process into a lithography pattern.

Further, in the case of FIG. 14, the resolution obtained by the projection exposure step is assumed to be one half of that of the probe exposure step, and the exposure pattern of the projection exposure is shown in blocks as having a side length two times as long as that of the blocks of the probe exposure. FIG. 15 shows an example in which an exposure pattern is formed to cover a wider area by varying the exposure amount of the projection exposure, taking the blocks as the units of variation. In the case of FIG. 15, the exposure pattern is replete with variations and not only has the resolution of the probe exposure but also includes a pattern other than the periodic pattern.

In the third embodiment, the projection exposure step is executed using blocks of a side length twice as long as that of the probe exposure step. However, the invention is of course not limited to this arrangement. According to the invention, the projection exposure step can be executed at any desired line width within the limit of resolution of the projection exposure to obtain a corresponding exposure pattern in combination with the probe exposure step.

The line width of the probe exposure in the third embodiment, as described above, is arranged to be the same in the two directions. However, the arrangement may be changed to have the line width in one direction different from the line width in the other direction. Further, an angle between the two directions, i.e., an angle formed by the two kinds of periodic patterns, can be decided as desired.

A fourth embodiment of the invention is described below with reference to FIGS. 21 to 24. The fourth embodiment is arranged to form an intermittent periodic pattern by the probe exposure step.

Figure 22:
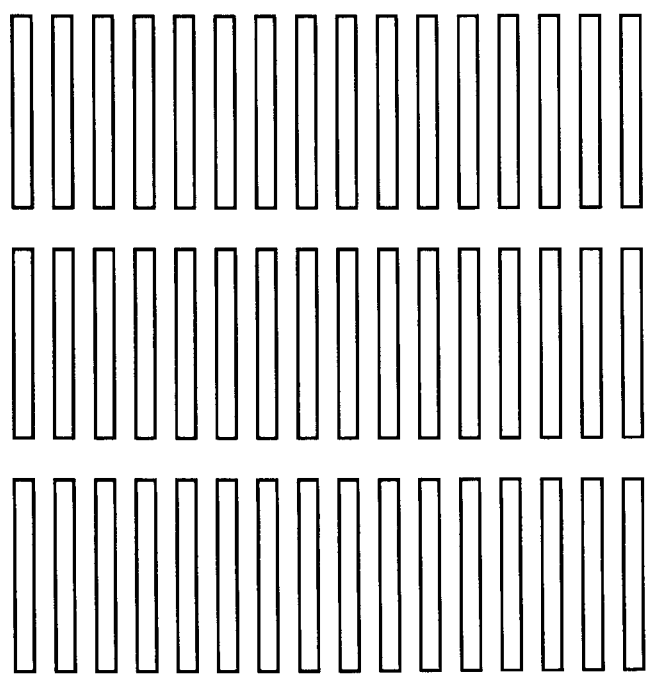
FIG. 22 schematically shows, by way of example, a periodic pattern.

FIG. 22 shows a one-dimensional intermittent periodic pattern obtained by the probe exposure according to the fourth embodiment.

Figure 21:
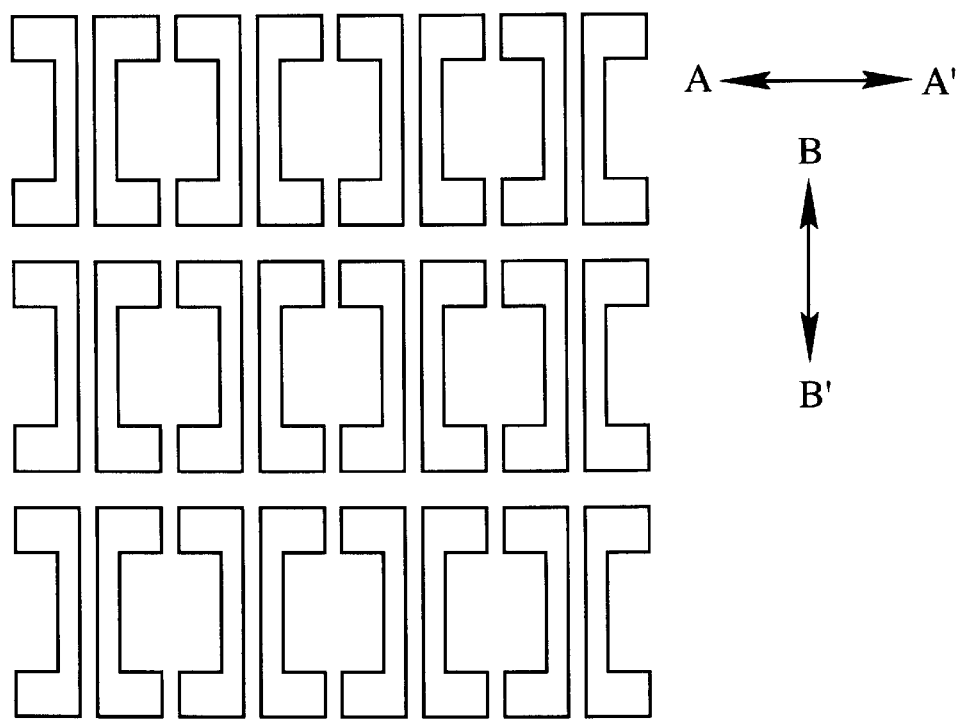
FIG. 21 schematically shows, by way of example, a circuit pattern.

FIG. 21 shows an exposure pattern obtained by a projection exposure step used in the fourth embodiment. This exposure pattern corresponds to a two-dimensional array of the so-called gate pattern formed according to the first embodiment described in the foregoing.

A feature of this pattern lies in that a high resolution is required in the direction of line A–A' (horizontal direction as viewed in FIG. 21) and in the direction of line B–B' (vertical direction as viewed FIG. 21) and that the basic gate patterns are spaced at a predetermined distance from each other. In view of this feature of the exposure pattern of the projection exposure step, it suffices to carry out a periodic pattern exposure with the probe exposure to form an intermittent periodic pattern as shown in FIG. 22. Such an intermittent periodic pattern makes it possible to improve throughput by moving parts to be exposed on the stage at a higher speed and to save exposure light energy. The throughput can be further improved by carrying out the exposure in such a way as to make the periodic pattern intermittent also in the direction of the period thereof.

Figure 23:
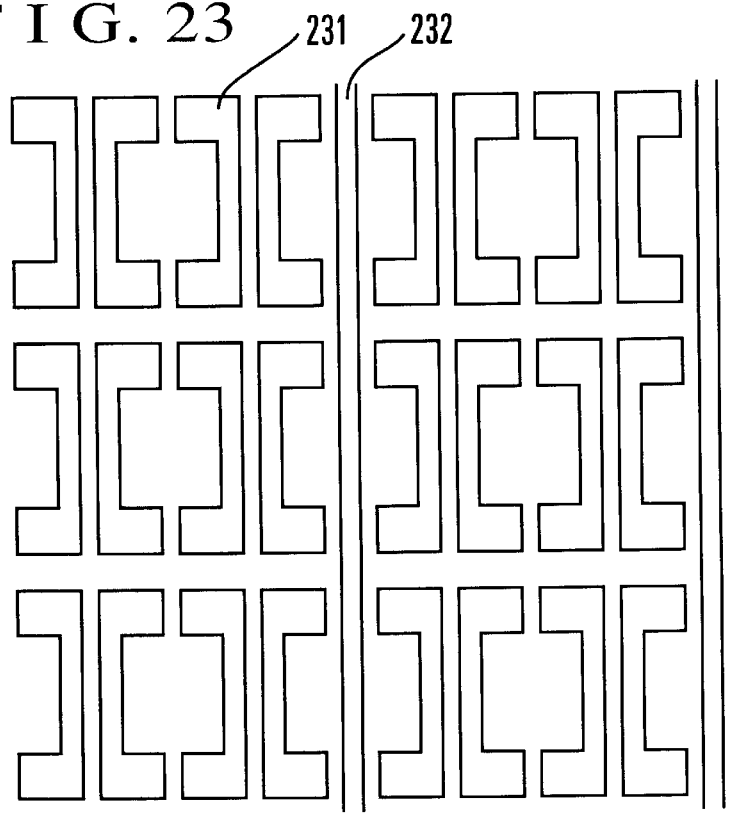
FIG. 23 schematically shows another example of a circuit pattern.
Figure 24:
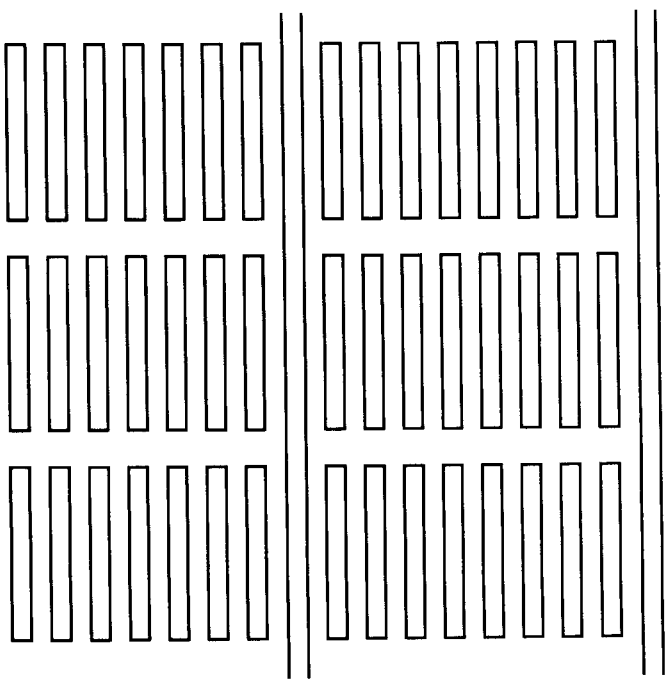
FIG. 24 schematically shows another example of a periodic pattern.

FIG. 23 shows a circuit pattern in which a wiring pattern 232 is intermixed with the above-stated gate pattern 231. In this case, it is possible to form such a circuit pattern as desired also by carrying out the probe exposure with an intermittent periodic pattern as shown in FIG. 24. Further, in this case, control over the multiple probe is performed by selectively performing on/off control over the probe exposure operation.

Figure 25:
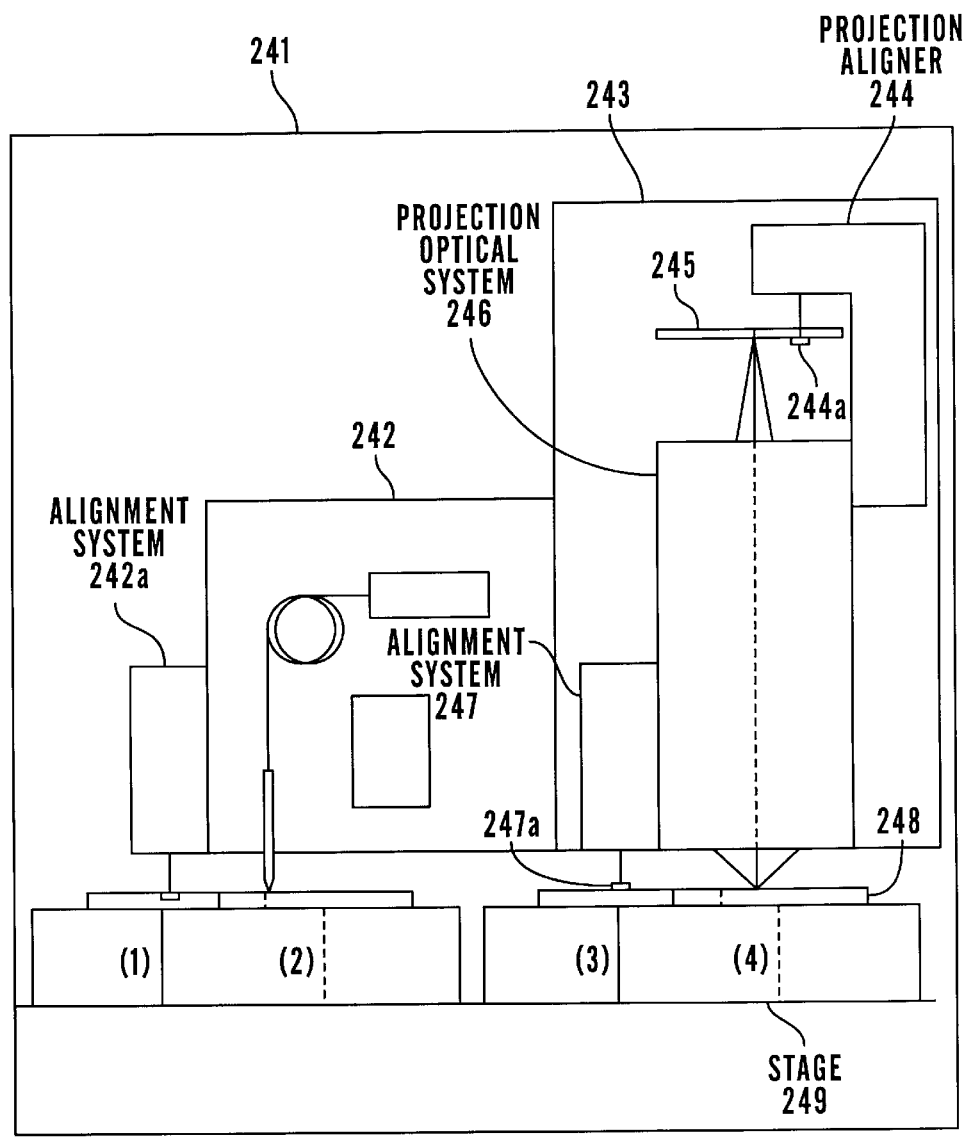
FIG. 25 schematically shows, by way of example, a projection aligner adapted for each of the embodiments of the invention.

FIG. 25 schematically shows, by way of example, the arrangement of a projection aligner according to each of the embodiments described above. As shown in FIG. 25, the projection aligner 241 is composed of a probe exposure part 242 and a projection exposure part 243. Each of the exposure parts 242 and 243 is provided with an alignment system 242a or 247. An exposure operation is performed in the following manner by moving a stage 249. With the stage 249 at a position (1), a distance between the optical axis of exposure and the optical axis of an alignment detector, i.e., a base line, is first measured by means of the alignment system 242a of the probe exposure part 242 to obtain information on the measured distance. The stage 249 is moved to a desired position (2) according to the obtained information. A probe exposure is made at the position (2) by the probe exposure part 242. After that, the stage 249 is moved to the visual field of the alignment system 247 of the projection exposure part 243 at a position (3). At the position (3), alignment is measured by using a wafer alignment mark 247a. The position of the stage 249 is adjusted to a position (4) where the position of the projection exposure becomes a predetermined position relative to the probe exposure. At the position (4), the projection exposure is made by projecting the pattern of a reticle 245 onto the surface of the wafer 248 through a projection optical system 246. The reticle 245 is positioned by means of an alignment system 244 provided with a reticle alignment mark 244a.

In the case of this example, each of the alignment systems is arranged to be operated by an off-axis alignment method. However, the invention is not limited to that method of alignment. The off-axis alignment method may be replaced as desired with an alignment method employed in ordinary exposure systems, such as a TTL (through-the-lens) alignment whereby the alignment mark is observed through the lens of the projection optical system or a TTR (through-the-reticle) alignment whereby the alignment mark is observed through the lens and the reticle.

While the probe exposure is arranged to be made prior to the projection exposure in the example described above, this sequence may be reversed.

The invention is not limited to the embodiments described above. The sequence of flow of operation, etc., may be variously modified and changed without departing from the spirit of the invention.

The probe exposure according to the invention of course may be carried out not only by using the probe for the NSOM but also by using some other probe such as a probe for the STM (scanning tunneling microscopy) or AFM (atomic force microscopy) exposure method, or a probe for the laser beam lithography, electron beam lithography or the like. It is also possible to make such modifications in various combinations. For example, the STM exposure method may be used for the probe exposure step while the electron beam block pattern exposure is used for the projection exposure step.

Particularly, the number of times of exposure and the number of steps of exposure amounts of the probe exposure step and the projection exposure step are adjustable and selectable as desired. Further, the manner in which the exposures are overlapped each other is adjustable by shifting exposure positions as desired. A circuit pattern thus can be variously formed by such adjustment. Further, the invention is not limited to the multiple exposure described above. The invention is applicable also to various known multiple exposure processes which include an exposure step of carrying out a probe exposure by using a mask and a projection aligner.

Next, a method for manufacturing a semiconductor device with the projection aligner arranged according to the invention in the multiple exposure mode described in the foregoing as one of a plurality of exposure modes is described by way of example below.

FIG. 26 is a flow chart showing a flow of processes for manufacturing a semiconductor device, such as a semiconductor chip of an IC or an LSI, a liquid crystal panel, a CCD or the like.

At a step 1 (circuit design), a circuit design for the semiconductor device is performed. At a step 2 (making of mask), a mask on which the designed circuit pattern is formed is made.

At a step 3 (manufacture of wafer), a wafer is manufactured by using a material such as silicon. At a step 4 (wafer process, called a preprocess), an actual circuit is formed on the wafer, by the lithography technique, using the mask and the wafer.

At a step 5 (assembly, called a postprocess), the wafer obtained at the step 4 is processed into a semiconductor chip through an assembly process (dicing and bonding), a packaging process (chip sealing), etc.

At a step 6 (inspection), the semiconductor device obtained at the step 5 is inspected by carrying out tests for its operation, its durability, etc. At a step 7, the semiconductor device thus completed through the above tests is shipped.

FIG. 27 is a flow chart showing the details of the above-stated wafer process. At a step 11 (oxidation), the surface of the wafer is oxidized. At a step 12 (CVD), an insulation film is formed on the surface of the wafer.

At a step 13 (formation of electrodes), electrodes are formed on the wafer by a vapor deposition process. At a step 14 (ion implantation), ions are implanted into the wafer. At a step 15 (resist process), a photosensitive material is coated on the wafer. At a step 16 (exposure), the circuit pattern of the mask is applied to the wafer by carrying out a baking exposure with the projection aligner described in the foregoing.

At a step 17 (developing), the exposed wafer is developed. At a step 18 (etching), parts other than the developed resist are scraped off. At a step 19 (stripping of resist), the resist which becomes unnecessary after the etching process is removed. With the above steps repeated, a multiple circuit pattern is formed on the wafer.

The manufacturing method described above permits the manufacture of a semiconductor device of a high degree of integration, which has been difficult to attain by the conventional manufacturing method.

What is claimed is:

1. An exposure system comprising:

a first exposure part which exposes a wafer with one of proximity field light and a tunneling current;

a second exposure part which projects and exposes a pattern formed in a mask onto the wafer; and a controller for causing said first exposure part and said second exposure part to perform exposures onto regions on the wafer, prior to development, such that the exposed regions on the wafer at least partially overlap each other.

2. A system according to claim 1, wherein at least one of the exposures made by said first and second exposure parts forms a distribution of multi-valued exposure amounts, having at least three values.

3. A system according to claim 1, wherein said first exposure part performs a periodic pattern exposure.

4. A system according to claim 1, wherein said first exposure part comprises a plurality of probes and performs exposure with a plurality of exposure beams emitted from said plurality of probes.

5. A system according to claim 1, wherein said first exposure part performs exposure with a plurality of exposure beams.

6. A system according to claim 5, wherein said first exposure part comprises a plurality of exposure beams arranged in a one-dimensional array and performs a desired pattern exposure by moving the plurality of exposure beams arranged in the one-dimensional array.

7. A system according to claim 5, wherein said first exposure part comprises a plurality of exposure beams arranged in a two-dimensional array and performs a desired pattern exposure by moving the plurality of exposure beams arranged in the two-dimensional array.

8. A system according to claim 1, wherein an exposure amount made by said first exposure part does not exceed a predetermined threshold value.

9. A system according to claim 1, wherein in one area of the wafer, both a first exposure amount by said first exposure part and a second exposure amount by said second exposure part do not exceed a predetermined exposure threshold value.

10. A system according to claim 9, wherein the sum of the first exposure amount and the second exposure amount exceeds the threshold value.

11. An exposure apparatus for performing exposure with an exposure system according to claim 1.

12. A method of manufacturing devices, comprising the steps of:

exposing a subject using an exposure system according to claim 1; and developing the exposed subject.

* * * * *

UNITED STATES PATENT AND TRADEMARK OFFICE
CERTIFICATE OF CORRECTION

PATENT NO. : 6,437,852 B1
DATED : August 20, 2002
INVENTOR(S) : Mitsuro Sugita

It is certified that error appears in the above-identified patent and that said Letters Patent is hereby corrected as shown below:

<u>Title page,</u>
Item [56], References Cited, patent "5,359,389 A * 10/1994 Ishohata" should read
-- 5,359,389 A * 10/1994 Isohata --; and patent "5,476,736 A * 12/1995 Tanabe et al."
should read -- 5,476,736 A * 12/1995 Tanabe --.

<u>Column 6,</u>
Line 58, "sum the of" should read -- sum of the --.

Signed and Sealed this

Seventeenth Day of December, 2002

JAMES E. ROGAN
*Director of the United States Patent and Trademark Office*